United States Patent
Sonoda et al.

(10) Patent No.: US 8,207,667 B2
(45) Date of Patent: Jun. 26, 2012

(54) ORGANIC EL DISPLAY AND MANUFACTURING METHOD THEREOF

(75) Inventors: Tooru Sonoda, Osaka (JP); Yuhki Kobayashi, Osaka (JP); Takeshi Hirase, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 236 days.

(21) Appl. No.: 12/663,760

(22) PCT Filed: Apr. 23, 2008

(86) PCT No.: PCT/JP2008/001070
§ 371 (c)(1),
(2), (4) Date: Dec. 9, 2009

(87) PCT Pub. No.: WO2009/028126
PCT Pub. Date: Mar. 5, 2009

(65) Prior Publication Data
US 2010/0194269 A1  Aug. 5, 2010

(30) Foreign Application Priority Data
Aug. 31, 2007  (JP) .................................. 2007-226386

(51) Int. Cl.
*H01L 51/00* (2006.01)
(52) U.S. Cl. ........................... 313/506; 313/504; 427/66
(58) Field of Classification Search .................. 313/504, 313/506; 427/66
See application file for complete search history.

(56) References Cited

U.S. PATENT DOCUMENTS

| | | | |
|---|---|---|---|
| 6,281,634 B1 | 8/2001 | Yokoyama | |
| 6,373,453 B1 | 4/2002 | Yudasaka | |
| 6,429,599 B1 | 8/2002 | Yokoyama | |
| 6,433,486 B1 | 8/2002 | Yokoyama | |
| 7,015,503 B2 | 3/2006 | Seki et al. | |
| 7,214,959 B2 | 5/2007 | Seki et al. | |
| 7,273,801 B2 | 9/2007 | Seki et al. | |
| 7,442,955 B2 | 10/2008 | Seki et al. | |
| 2002/0060518 A1 | 5/2002 | Duineveld et al. | |
| 2002/0075207 A1 | 6/2002 | Yudasaka | |
| 2003/0206144 A1 | 11/2003 | Yudasaka | |
| 2004/0201048 A1 | 10/2004 | Seki et al. | |
| 2005/0170076 A1 | 8/2005 | Seki et al. | |
| 2005/0170550 A1 | 8/2005 | Seki et al. | |
| 2005/0186403 A1 | 8/2005 | Seki et al. | |

(Continued)

FOREIGN PATENT DOCUMENTS

EP  0 940 796 A1  9/1999

(Continued)

OTHER PUBLICATIONS

Official Communication issued in International Patent Application No. PCT/JP2008/001070, mailed on May 20, 2008.

*Primary Examiner* — Karabi Guharay
(74) *Attorney, Agent, or Firm* — Keating & Bennett, LLP

(57) ABSTRACT

An organic EL display includes a substrate on which pixel areas are arranged in a matrix; first and second electrodes; functional material layers each including a carrier transport layer and a non-carrier transport layer; and a barrier to define the pixel areas. The barrier includes communication recesses arranged to extend the non-carrier transport layers from respective first pixel areas to respective second pixel areas adjacent to each other in the pixel areas defined by the barrier.

9 Claims, 12 Drawing Sheets

U.S. PATENT DOCUMENTS

| | | |
|---|---|---|
| 2006/0113897 A1* | 6/2006 | Fukase .................. 313/504 |
| 2007/0148333 A1 | 6/2007 | Morimoto |
| 2008/0036699 A1 | 2/2008 | Yudasaka |
| 2009/0020751 A1 | 1/2009 | Seki et al. |

FOREIGN PATENT DOCUMENTS

| | | |
|---|---|---|
| EP | 0 982 974 A1 | 3/2000 |
| EP | 0 989 778 A1 | 3/2000 |
| EP | 1 006 586 A2 | 6/2000 |
| EP | 1 006 588 A2 | 6/2000 |
| EP | 1 372 195 A2 | 12/2003 |
| EP | 1 524 696 A2 | 4/2005 |
| EP | 1 793 650 A2 | 6/2007 |
| JP | 2004-288403 A | 10/2004 |
| WO | 02/41400 A1 | 5/2002 |

* cited by examiner

ORGANIC EL DISPLAY AND MANUFACTURING METHOD THEREOF

BACKGROUND OF THE INVENTION

1. Field of the Invention

The present invention relates to organic EL displays and manufacturing methods thereof.

2. Description of the Related Art

In recent years, liquid crystal displays have been frequently used as flat-panel displays in a wide variety of fields. However, liquid crystal displays in which contrast and color significantly vary depending on the viewing angles and which need a backlight as a light source, still have critical problems, such as the difficulty in reducing power consumption and the limits in reducing thickness and weight. Therefore, self-luminous displays using, e.g., organic electroluminescence (hereinafter referred to as "organic EL") have recently been expected to be substitutes for liquid crystal displays. In an organic EL device, upon passage of a current through an organic EL layer sandwiched between positive and negative electrodes, organic molecules in the organic EL layer emit light. Organic EL displays using organic EL devices are self-luminous, and thus have advantages in achieving smaller thickness, lighter weight, and lower power consumption. In addition, organic EL displays using organic EL devices have wide viewing angles, and therefore, are drawing considerable attention as probable next-generation flat-panel displays. Such organic EL displays, making use of their small thickness and wide viewing angles, are actually finding increasing practical application as displays for portable music devices and cellular phones.

In general, organic EL devices are manufactured by different methods depending on the type of functional material used therein. For example, when high molecular weight organic compounds are used as a functional material, the functional material is formed into a film by a wet method, such as a spin coating process, a screen deposition process, or an inkjet system. When low molecular weight organic compounds are used as the functional material, a dry method, such as a vacuum evaporation process or a sputtering process, is often used to form a film from the functional material.

Among the film forming techniques mentioned above, the inkjet system has excellent advantages; for example, the inkjet system in general allows more efficient use of film-forming material than the other methods, enables patterning without the need for a mask, and is readily applicable to manufacture of large-area organic EL displays. Therefore, manufacturing of organic EL devices using the inkjet system has been studied actively.

For example, Japanese Laid-Open Publication No. 2000-106278 describes the use of an inkjet type recording head in manufacturing an organic EL device that includes, between electrodes, hole injection transport layers containing conductive molecules and light emitting layers containing luminescent organic molecules. The inkjet type recording head is used to form the hole injection transport layers and the light emitting layers.

In the inkjet system, a barrier (a bank) for retaining discharged droplets within pixel areas is typically formed. This bank often has liquid repellency to prevent discharged droplets from leaking out into adjacent pixel areas. For example, Japanese Patent Publication No. 3328297 discloses a method in which the non-affinity (liquid repellency) of a bank is increased as compared with electrode surfaces within pixel areas by performing plasma processing using a gas containing fluorine compound or the like, thereby confining droplets within the pixel areas. Without such plasma processing performed in Japanese Patent Publication No. 3328297, it is also possible to render a bank repellent to droplets by forming the bank using a material containing fluorine compounds, for example. Furthermore, if the pixel areas located inside the bank are rendered lyophilic by UV processing or by plasma processing using an oxygen gas or the like, the difference in affinity for droplets between the bank and the inside of the pixel areas will increase, allowing more reliable retention of droplets within the pixel areas.

Japanese Laid-Open Publication No. 2004-6362 describes that if hole transport layers, electron transport layers, and negative electrodes are formed so as to extend through multiple pixels, it is possible to eliminate the need for the process step of etching back the hole transport layers and the electron transport layers, and the process step of forming a barrier. Japanese Laid-Open Publication No. 2004-6362 also describes that light emitting layers, formed in the same shape as, but larger than, positive electrodes, can prevent leakage current and concentration of electric field occurring in the edges of the positive electrodes. In Japanese Laid-Open Publication No. 2004-6362, it is assumed that the hole transport layers and the electron transport layers have high resistance, and based on this assumption, short-circuits between the positive and negative electrodes are prevented.

Carrier transport layers in an organic EL device typically have lower resistance and higher conductivity than light emitting layers so that a sufficient electric field is applied to the light emitting layers. In some cases, to prevent carriers from passing through the light emitting layers without contributing to light emission, a functional material layer, called a carrier blocking layer, which confines carriers within the light emitting layers, is formed between the carrier transport layers and the light emitting layers. However, such carrier blocking layers typically have low conductivity, and therefore, are often formed so as to be much thinner than the light emitting layers.

Now, it is assumed that, using an inkjet system, a hole transport layer, a light emitting layer, and a negative electrode are applied and stacked in that order on a pixel surrounded by a bank. Droplets containing a functional material for forming the hole transport layer are discharged inside the bank, and then dried and heated to remove the solvent, thereby forming the hole transport layer in the pixel. The next step is to discharge droplets containing a functional material for forming the light emitting layer on that layer. In this step, if the lyophilic property of the hole transport layer with respect to the light emitting layer formed thereon is insufficient, or if the droplets for forming the light emitting layer have excessively high surface tension, or even if neither of these is the case, depending on the shape of the bank, the droplets may not be retained inside the bank so as to completely cover the hole transport layer and the positive electrode. In that case, the light emitting layer formed through drying and heating processes also does not completely cover the hole transport layer and the positive electrode, causing the hole transport layer to be partially exposed. In this state, if a negative electrode is formed on those layers by a vacuum evaporation process or the like, then the exposed areas of the hole transport layer and positive electrode will make direct contact with the negative electrode without interposition of the light emitting layer. These contact areas do not contribute to light emission when current is passed through each pixel of the organic EL device for light emission. In addition, in those contact areas, current loss causes a decrease in intensity, and leakage current causes generation of heat, an increase in power consumption, etc., resulting in a serious problem in power efficiency and in device lifetime. Therefore, it is necessary that the light emitting layer completely cover the hole transport layer and the positive electrode. To completely cover the hole transport layer and the positive electrode with the light emitting layer, the amount of each droplet for forming the light emitting layer could be possibly increased. However, if an excessive amount of droplet is discharged in the pixel, the droplet might spill over the bank so as to flow out into unintended adjacent pixels. Moreover, such an excessive amount of the droplet also causes a problem in that a desired thickness cannot be achieved.

In a case where the hole transport layer is not used, and an electron transport layer is stacked on the light emitting layer instead, the result is the same. If the positive electrode is not completely covered with the light emitting layer, and is partially exposed, the electron transport layer makes direct contact with the positive electrode without interposition of the light emitting layer. As a result, in the contact areas, current loss causes a decrease in intensity, and leakage current causes generation of heat and an increase in power consumption, because the electron transport layer has lower resistance than the light emitting layer.

Also, in a case where the hole transport layer and the electrode transport layer are both used, the above-described problems also occur due to contact made, without interposition of the light emitting layer, between the positive and negative electrodes, between the hole transport layer and the electron transport layer, between the hole transport layer and the negative electrode, and between the electron transport layer and the positive electrode.

In the case of the materials used by the present inventors, hole transport layers and electron transport layers have lower resistance than light emitting layers. With such materials, it is not possible to prevent short-circuits between the positive and negative electrodes in the structure of Japanese Laid-Open Publication No. 2004-6362. In addition, as set forth above, it is desired that a voltage drop in carrier transport layers be as small as possible, that is, the resistance of the carrier transport layers be minimized, in order to apply a sufficient electric field to the light emitting layers.

A barrier is provided in Japanese Laid-Open Publication No. 2004-6362 in order to provide insulation between the positive and negative electrodes, and to prevent light emitting layers of different colors in adjacent pixels from mixing with each other to thereby cause a reduction in color purity. Therefore, it is difficult to eliminate the need for the process step of forming the barrier that is provided to retain droplets in respective pixel areas in a coating method, such as an inkjet system, for example.

SUMMARY OF THE INVENTION

In view of the above problems, preferred embodiments of the present invention provide an organic EL display capable of high quality display, in which leakage between electrodes is prevented without adding any manufacturing process steps, and provide a manufacturing method thereof.

An organic EL display according to a preferred embodiment of the present invention includes a substrate on which pixel areas are arranged in a matrix. First electrodes, second electrodes, functional material layers, and a barrier defining the pixel areas are disposed over the substrate. The functional material layers are arranged in the respective pixel areas between the first and second electrodes, and each includes a carrier transport layer and a non-carrier transport layer. The barrier includes communication recesses arranged to extend the non-carrier transport layers from respective first pixel areas to respective second pixel areas, each first pixel area and each second pixel area being adjacent to each other in the pixel areas defined by the barrier. Here, the aforementioned term "carrier transport layers" means functional material layers functioning to transport carriers (holes or electrons), and generally means layers having a conductivity of about $10^{-6}$ S/cm or higher with respect to either holes or electrons during application of an electric field of about $10^4$ V/cm at room temperature, for example. Also, the term "non-carrier transport layers" mentioned above means functional material layers other than the carrier transport layers and including light emitting layers and carrier blocking layers, and generally means layers having a conductivity lower than about $10^{-6}$ S/cm during application of an electric field of about $10^4$V/cm at room temperature, for example.

Advantages of this structure will be discussed by making comparisons with a conventional structure. FIG. 11 is a plan view of a substrate 101 with a pixel area 102 formed thereon in the structure of a conventional organic EL display 100. FIG. 12 is a cross-sectional view taken along the line A"-A" of FIG. 11. FIGS. 13 to 15 show process steps for stacking layers. FIG. 16 shows a cross-sectional view taken along the line B"-B" of FIG. 11. In the structure of the conventional organic EL display 100, droplets 110 containing a hole transporting material are applied on a positive electrode 112 by an inkjet system, for example, as shown in FIG. 13, and are then dried and baked, thereby forming a hole transport layer 113 shown in FIG. 14. Thereafter, droplets 115 for forming a light emitting layer 114 are similarly applied by an inkjet system. In this process step, if the hole transport layer 113 does not have sufficient wettability with respect to the droplets 115 thereon, and thus does not allow the droplets 115 to sufficiently spread over, then the droplets 115 shrink due to the surface tension. Consequently, the droplet 115 accumulating in the central portion of the pixel area 102 as shown in FIG. 15 is retained, causing a portion of a barrier 116 formed on a $SiO_2$ layer 117 on the substrate 101 to be kept from contact with the droplet 115. After drying and baking processes, the light emitting layer 114 sufficiently covers the hole transport layer 113 in the width direction of the pixel area 102 (the row direction R in FIG. 11) as shown in FIG. 16, however, in the length direction (the column direction C in FIG. 11), an exposed portion of the hole transport layer 113 remains as shown in FIG. 12. If a negative electrode 121 is formed in this state, or is formed after stacking an electron transport layer on the hole transport layer 113, the hole transport layer 113 makes contact with the negative electrode 121 or the electron transport layer without interposition of the light emitting layer 114. As a result, in those contact areas, as in the areas surrounded with the dashed circles 120 in FIG. 12 where the hole transport layer 113 is in direct contact with the negative electrode 121, leakage current that does not contribute to light emission causes current loss and generation of heat.

On the other hand, in the organic EL display according to a preferred embodiment of the present invention, the first and second electrodes, the functional material layers, and the barrier for defining the pixel areas are formed. The functional material layers are provided in the respective pixel areas between the first and second electrodes, and each includes a carrier transport layer and a non-carrier transport layer. The barrier is formed with communication recesses arranged to extend the non-carrier transport layers from respective first pixel areas to respective second pixel areas, each first pixel area and each second pixel area being adjacent to each other in the pixel areas defined by the barrier. This structure prevents droplet accumulation that occurs in the conventional structure in which the droplets for forming the non-carrier transport layers accumulate in the respective central portions of the pixel areas. Accordingly, this structure prevents contact between the carrier transport layers, and contact between the hole transport layers (carrier transport layers) and the negative electrodes, between the electron transport layers (carrier transport layers) and the positive electrodes, and between the positive and negative electrodes from being made without interposition of the non-carrier transport layers using a low-conductivity organic layer or the like. Consequently, leakage current that occurs in the conventional structure is prevented. Furthermore, since the carrier transport layers are confined within the respective pixel areas, the barrier between adjacent pixel areas is used effectively. Specifically, depending on several factors, such as the droplet retention capability of the barrier, whether or not to apply droplets on the communication recesses located between adjacent pixel areas, and control of the amount of droplet to be applied, it becomes possible to form the carrier transport layers in the separate pixel areas, and to extend at least one type of non-carrier transport layer through adjacent pixel areas. In addition, the barrier produces other effects. For example, even if droplets for forming other non-carrier transport layers join together between adjacent pixel areas, the barrier retains such droplets within the respective pixel areas by preventing those droplets from flowing into the adjacent pixel areas to cause uneven distribution.

In the organic EL display according to a preferred embodiment of the present invention, the barrier may include pixel area defining recesses which define the pixel areas; and the communication recesses may be arranged so as to extend continuously from the pixel area defining recesses of the barrier and to have a narrower width than the pixel area defining recesses.

In this structure, the barrier includes the pixel area defining recesses which define the pixel areas, and the communication recesses are arranged so as to extend continuously from the pixel area defining recesses of the barrier and to have a narrower width than the pixel area defining recesses. Therefore, the communication recesses allow the non-carrier transport layers to extend through adjacent pixel areas. On the other hand, since the communication recesses have a narrower width than the pixel area defining recesses, it is possible to prevent the carrier transport layers from extending, and their droplets from flowing, into adjacent pixel areas, thereby enabling the formation of the carrier transport layers in the separate pixel areas.

Furthermore, in the organic EL display according to a preferred embodiment of the present invention, the barrier may include first linear portions and second linear portions each arranged continuously in a column or row direction of the pixel areas so that each of the pixel areas arranged in a matrix on the substrate is sandwiched between respective ones of the first linear portions and the second linear portions, and island-shaped portions each provided between respective ones of the first linear portions and the second linear portions and between respective ones of the first pixel areas and the second pixel areas. Each communication recess may include spaces located between respective ones of the first linear portions and the second linear portions and one of the island-shaped portions provided therebetween.

In this structure, the barrier includes the first linear portions and the second linear portions each arranged continuously in the column or row direction of the pixel areas, and island-shaped portions each provided between respective ones of the first pixel areas and the second pixel areas. Also, each communication recess includes spaces located between respective ones of the first linear portions and the second linear portions and one of the island-shaped portions provided therebetween. Therefore, the communication recesses allow the non-carrier transport layers to extend through adjacent pixel areas. On the other hand, since the communication recesses have a narrower width than the pixel areas (whose width is equal to the distance between the first and second linear portions), it is possible to prevent the carrier transport layers from extending, and their droplets from flowing, into adjacent pixel areas, thus enabling the formation of the carrier transport layers in the separate pixel areas.

Also, in the organic EL display according to a preferred embodiment of the present invention, the island-shaped portions may be arranged such that two or more of those island-shaped portions are located in parallel or substantially in parallel with each other in the column and/or row direction of the pixel areas.

In this structure, the island-shaped portions are arranged such that two or more of those island-shaped portions are located in parallel or substantially in parallel with each other in the column and/or row direction of the pixel areas. This prevents the carrier transport layers from extending, and their droplets from flowing, into adjacent pixel areas in a more favorable manner, thus enabling the carrier transport layers to be formed in the separate pixel areas more effectively.

Moreover, in the organic EL display according to a preferred embodiment of the present invention, a total width of each communication recess may be greater than about one-sixth of, but smaller than about five-sixths of, a width of each pixel area defined by the barrier, for example.

In this structure, the total width of each communication recess is preferably greater than about one-sixth of, but smaller than about five-sixths of, the width of each pixel area defined by the barrier, for example. This makes it easier to prevent the carrier transport layers from extending, and their droplets from flowing, into adjacent pixel areas, and thus facilitates the formation of the carrier transport layers in the separate pixel areas. This also makes it easier to extend at least one type of non-carrier transport layer using another organic layer through adjacent pixel areas.

If the total width of each communication recess is not within the above range, such a width will increase the possibility of failure to form the carrier transport layers in the separate pixel areas, or conversely, the possibility that no layers can be extended through adjacent pixel areas.

Also, in the organic EL display according to a preferred embodiment of the present invention, each carrier transport layer and each non-carrier transport layer may include a plurality of layers; at least one of the layers of each carrier transport layer may be separated between the respective first pixel area and the respective second pixel area adjacent to each other; and at least one of the layers of each non-carrier transport layer may extend from the respective first pixel area to the respective second pixel area adjacent to each other.

In this structure, at least one of the layers of each carrier transport layer is separated between the respective first pixel area and the respective second pixel area adjacent to each other, and at least one of the layers of each non-carrier transport layer extends from the respective first pixel area to the respective second pixel area adjacent to each other. Therefore, contact between the carrier transport layers, and contact between the hole transport layers (carrier transport layers) and the negative electrodes and between the electron transport layers (carrier transport layers) and the positive electrodes are prevented without interposition of the non-carrier transport layers using a low-conductivity organic layer or the like. Accordingly, leakage current that occurs in the conventional structure is prevented.

Furthermore, in the organic EL display according to a preferred embodiment of the present invention, each non-carrier transport layer may include a plurality of layers; and all of the layers of each non-carrier transport layer may extend from the respective first pixel area to the respective second pixel area adjacent to each other.

In this structure, all of the layers of each non-carrier transport layer extend from the respective first pixel area to the respective second pixel area adjacent to each other. Therefore, droplet accumulation in the respective central portions of the pixel areas, which occurs in the conventional structure as shown in FIG. 15, is prevented in each layer. This prevents contact between the carrier transport layers, and contact between the hole transport layers (carrier transport layers) and the negative electrodes and between the electron transport layers (carrier transport layers) and the positive electrodes from being made without interposition of the non-carrier transport layers using a low-conductivity organic layer or the like. Hence, leakage current that occurs in the conventional structure is prevented more favorably.

Moreover, in the organic EL display according to a preferred embodiment of the present invention, each carrier transport layer may include a plurality of layers; and all of the layers of each carrier transport layer may be separated between the respective first pixel area and the respective second pixel area adjacent to each other.

In this structure, all of the layers of each carrier transport layer are separated between the respective first pixel area and the respective second pixel area adjacent to each other. This prevents contact between the hole transport layers (carrier transport layers) and the negative electrodes and between the electron transport layers (carrier transport layers) and the positive electrodes more favorably, thereby more reliably preventing leakage current that occurs in the conventional structure.

A method for manufacturing an organic EL display according to a preferred embodiment of the present invention includes the steps of forming first electrodes in a matrix arrangement on a substrate to provide pixel areas; forming a barrier on the substrate so that the barrier defines the pixel areas; forming communication recesses in the barrier such that each communication recess extends from a respective first pixel area to a respective second pixel area adjacent to each other in the pixel areas defined by the barrier; forming at least one carrier transport layer inside the barrier that defines the pixel areas; forming at least one non-carrier transport layer by an inkjet system from the respective first pixel area to the respective second pixel area across the communication recess provided therebetween; and forming second electrodes in the pixel areas on the substrate in which the at least one carrier transport layer and the non-carrier transport layers have been formed.

In this structure, at least one carrier transport layer having a high conductivity is provided in the respective pixel areas. Also, at least one non-carrier transport layer (carrier blocking layer, light emitting layer, etc.) using a low conductivity organic layer or the like is formed by an inkjet system from the respective first pixel area to the respective second pixel area across the communication recess provided therebetween. This allows droplets in adjacent pixel areas to join together, thus enabling the non-carrier transport layers to extend through the adjacent pixel areas. That is, droplet accumulation in the central portion of each pixel area, that occurs in the conventional structure as shown in FIG. 15, is prevented. Accordingly, contact between the carrier transport layers, and contact between the hole transport layers (carrier transport layers) and the negative electrodes, between the electron transport layers (carrier transport layers) and the positive electrodes, and between the positive and negative electrodes are prevented without interposition of the non-carrier transport layers using a low-conductivity organic layer or the like. Hence, it is possible to prevent leakage current that occurs in the conventional structure. Furthermore, since the carrier transport layers are confined within the respective pixel areas, the barrier between adjacent pixel areas is used effectively. Specifically, depending on several factors, such as the droplet retention capability of the barrier, whether or not to apply droplets on the communication recesses located between adjacent pixel areas, and control of the amount of droplet to be applied, it becomes possible to form the carrier transport layers in the separate pixels, and to extend at least one type of non-carrier transport layer through adjacent pixel areas. In addition, the barrier produces other effects. For example, even if droplets for forming other non-carrier transport layers join together between adjacent pixel areas, the barrier retains such droplets within the respective pixel areas by preventing those droplets from flowing into the adjacent pixel areas to cause uneven distribution.

In the method for manufacturing an organic EL display according to a preferred embodiment of the present invention, the barrier and the communication recesses provided therein may be formed simultaneously using the same material.

In this structure, since the barrier and the communication recesses provided therein are formed simultaneously using the same material, efficiency and cost in manufacturing the display are improved.

Various preferred embodiments of the present invention provide an organic EL display capable of high quality display, in which leakage between electrodes is reduced without adding any manufacturing process steps, and also provide a manufacturing method thereof.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
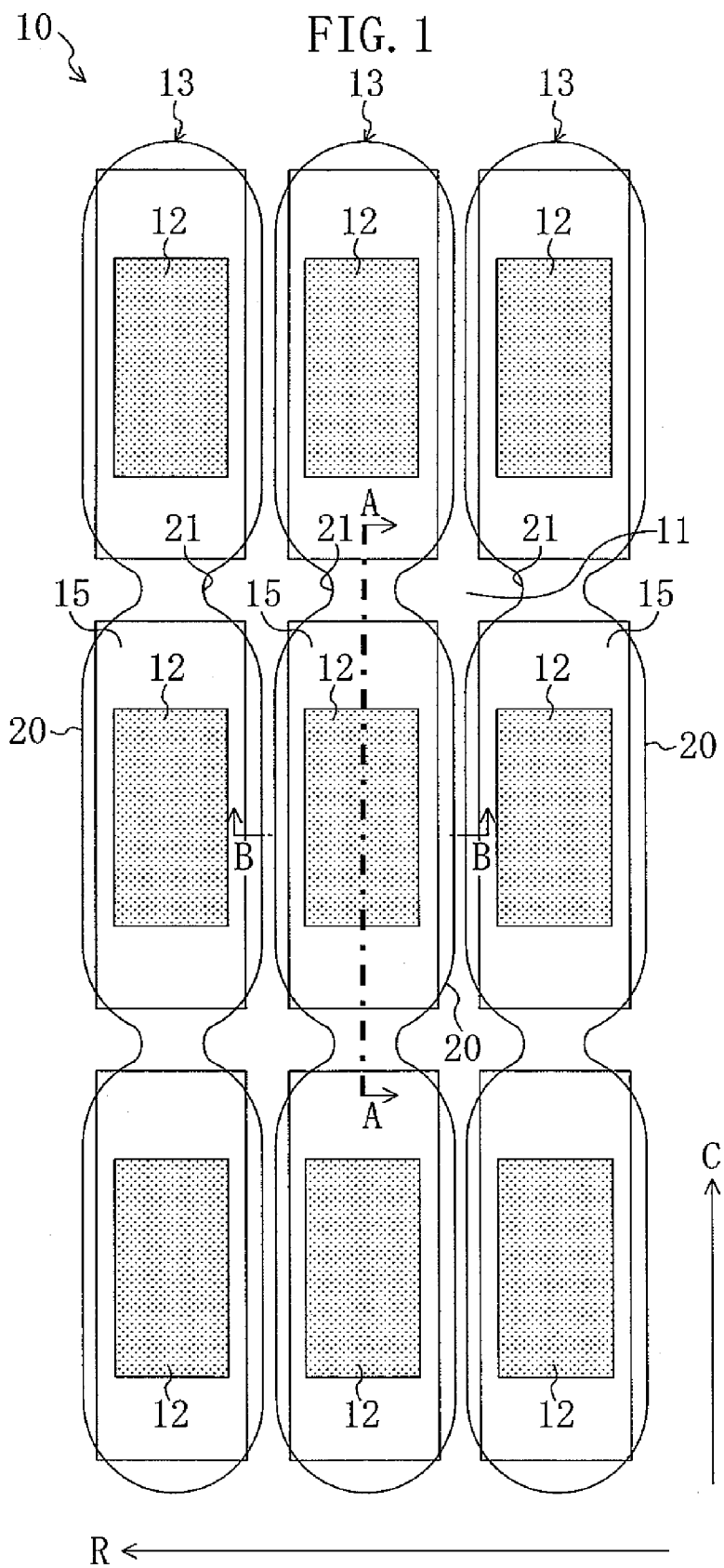
FIG. 1 is a plan view of a substrate in an organic EL display according to a preferred embodiment of the present invention, showing a positional relationship between pixel areas and a barrier formed on the substrate.

Preferred embodiments of the present invention will be hereinafter described in detail. It should be noted that the present invention is not limited to the following preferred embodiments.

An organic EL display includes a substrate on which pixel areas are arranged in a matrix.

On the substrate, thin film transistors (TFTs), signal lines and other lines, and a planarizing layer are provided. First electrodes (positive or negative electrodes) are disposed on the planarizing layer. The substrate including these elements defines an active matrix substrate.

The substrate need not necessarily be an active matrix substrate, and may form, for example, a passive matrix substrate, which is a substrate on which signal lines and first electrodes are provided.

On the first electrode in each pixel area, a functional material layer and a second electrode (negative or positive electrode) are stacked in that order.

The functional material layers include carrier transport layers and non-carrier transport layers provided in the pixel areas between the first and second electrodes.

An insulating barrier (bank) is also disposed over the substrate to define the pixel areas and to retain droplets applied by an inkjet system when the functional material layers are formed.

The barrier includes communication recesses each arranged to extend a non-carrier transport layer from a first pixel area to a second pixel area adjacent to each other in the pixel areas defined by the barrier. The structures of the barrier and communication recesses are selectable from various ones, and a detailed description will be provided with respect to "Examples" described later.

The TFTs and other active elements on the active matrix substrate are separated from the functional material layers by an interlayer dielectric film functioning as the planarizing layer. Through contact holes formed through the interlayer dielectric film, these active elements are connected with the first electrodes thereover by a connecting conductor filling the contact holes. As the connecting conductor, organic EL first electrodes may also be used.

The functional material layers may be low molecular weight material or high molecular weight material. Structures (1) to (5) shown below are example structures for the functional material layers. Nevertheless, the present invention is not limited to those structures so long as a carrier transport layer is included. Here, "the carrier transport layer" means a hole transport layer or an electron transport layer. In some cases, a light emitting layer also functions as a carrier transport layer. In those cases, however, such a layer mainly functions as a light emitting layer, and therefore, is not regarded as a carrier transport layer. An electron blocking layer, which will be described later, is one type of carrier blocking layer. In the present invention, all of the following layers (carrier transport layers and non-carrier transport layers) are generally called functional material layers.

(1) Hole transport layer/Organic light emitting layer (2) Organic light emitting layer/Electron transport layer (3) Hole transport layer/Organic light emitting layer/Electron transport layer (4) Hole injection layer/Hole transport layer/Organic light emitting layer/Electron transport layer (5) Hole transport layer/Electron blocking layer/Organic light emitting layer/Electron transport layer The organic light emitting layers described above may have a single-layer or multi-layer structure, and may be layers containing a host material doped with a dopant.

Now, organic EL using a high molecular weight organic light emitting layer will be discussed by way of example. It should however be noted that the present invention is not limited to this, and a low molecular weight organic light emitting layer may also be used. It should also be noted that though the present invention preferably uses an inkjet system to stack the above-described functional material layers, such stacking need not necessarily be performed by an inkjet system, but may be performed using any other method in which a bank for retaining a solution is provided, and the functional material layers are formed by applying droplets on any other layers. For example, the above structure (4) may be obtained as follows: an inorganic substance used for a hole transport layer is stacked over a substrate by a sputtering or evaporation process, a bank is then formed, and an organic light emitting layer and an electron transport layer are then stacked by an inkjet system.

The solution applied to form the organic light emitting layer includes at least some luminescent material, and may include one type of luminescent material or many different types of luminescent materials. The solution may also contain a film-holding material (binder), a leveling material, an emission-assist material, an add-in material (donor, acceptor, etc.), a carrier transporting material, a luminescent dopant, and the like.

For luminescent materials, any luminescent materials known to be suitable for organic LED devices may be used. Such luminescent materials are classified into high molecular weight luminescent materials, precursors of high molecular weight luminescent materials, and the like. Specific examples of compounds of such materials will be provided below, however, the present invention is not limited to these examples.

Examples of compounds that can be used as high molecular weight luminescent materials include: poly(2-decyloxy-1,4-phenylene) (DO-PPP); poly[2,5-bis-[2-(N,N,N-triethylammonium)ethoxy]-1,4-phenyl-alto-1,4-phenylene] dibromide (PPP-NEt$^{3+}$); poly[2-(2'-ethylhexyloxy)-5-methoxy-1,4-phenylenevinylene] (MEH-PPV), and the like.

Examples of compounds that can be used as precursors of high molecular weight luminescent materials include: poly(p-phenylenevinylene) precursor (Pre-PPV); poly(p-naphthalenevinylene) precursor (Pre-PNV), and the like.

Any solvent that can dissolve or disperse those luminescent materials may be used. Examples of such a solvent include: pure water, methanol, ethanol, THF (tetrahydrofuran), chloroform, toluene, xylene, trimethylbenzene, and the like.

The hole transport layer and the electron transport layer (carrier transport layers) may both have a single-layer or multi-layer structure, and may also function as injection layers.

The carrier transport layers, like the light emitting layer material, may be formed not only by an inkjet system but also by any other known method.

For carrier transporting materials, any well-known materials may be used. Specific examples of compounds of such materials are shown below, however, the present invention is not limited to these examples.

Examples of compounds that can be used as hole transporting materials include: low molecular weight materials, such as porphyrin compounds, aromatic tertiary amine compounds including N,N'-bis-(3-methylphenyl)-N,N'-bis-(phenyl)-benzidine (TPD) and N,N'-di(naphthalene-1-yl)-N,N'-diphenyl-benzidine (NPD), hydrazone compounds, quinacridone compounds, and styrylamine compounds; high molecular weight materials, such as polyaniline, 3,4-polyethylenedioxythiophene/polystyrenesulfonate (PEDOT/PSS), poly(triphenylamine derivatives), and polyvinylcarbazole (PVCz); and precursors of high molecular weight materials, such as poly (p-phenylenevinylene) precursors and poly(p-naphthalene vinylene) precursors.

Examples of compounds that can be used as electron transporting materials include: low molecular weight materials, such as oxadiazole derivatives, triazole derivatives, benzoquinone derivatives, naphthoquinone derivatives, and fluorene derivatives; and high molecular weight materials such as poly[oxadiazole].

Carrier blocking layers may have a single-layer or multi-layer structure.

Carrier blocking layers, like the light emitting layer material, may be formed not only by an inkjet system but also by any other known method.

For carrier blocking materials, any well-known materials may be used. Specific examples of compounds of such materials are shown below, however, the present invention is not limited to these examples.

Examples of compounds that can be used as electron blocking materials include: low molecular weight materials, such as N,N'-bis-(3-methylphenyl)-N,N'-bis-(phenyl)-benzidine (TPD); and high molecular weight materials, such as polyvinylcarbazole (PVCz). Examples of compounds that can be used as hole blocking materials include high molecular weight materials, such as oxadiazole derivatives.

Any solvent used for the luminescent materials can be used as a solvent for carrier blocking materials. However, for example, when a light emitting layer is stacked on a hole transport layer by an inkjet system, a hole transporting material soluble in the solvent used for the luminescent material is dissolved in that solvent during the formation of the light emitting layer, causing a reduction in film uniformity. In view of this, the functional material used in the earlier stage is preferably a material that is not soluble in the solvent used for the functional material stacked in the later stage.

For each layer in the electrodes, any well-known electrode materials may be used. A film, such as a carrier injection layer, may be inserted at the interface between an electrode layer and a functional material layer when necessary.

For positive electrodes, a single-layer film of a high work function metal material (Au, Ni, Pt or the like) or conductive metallic oxide (ITO, IZO, ZnO, $SnO_2$ or the like), or a multi-layer film of combination of such materials may be used. Also, an oxide having a thickness (about 1 nm, for example) that does not significantly hinder the conductivity may be stacked on the respective sides of positive electrodes that are in contact with a functional material layer.

Electrode materials that can be used for negative electrodes include low work function materials having a work function of about 4.0 eV or less, for example, such as Ca, Ce, Cs, Rb, Sr, Ba, Mg, and Li. Suitable materials with respect to a high molecular weight organic light emitting layer are Ca and Ba. In order to prevent degradation of such low work function electrodes due to oxygen, water and the like, an alloy of such a low work function material and a metal that is scientifically relatively stable, such as Ni, Os, Pt, Pd, Al, Au, Rh, or Ag, or a multi-layer structure including such a low work function material and a relatively stable metal is preferably used for negative electrodes. Furthermore, in the case of top-emission organic EL, negative electrodes need to be thin enough to be translucent. Therefore, in order to ensure sufficiently high conductivity as electrodes, a conductive metallic oxide, such as ITO, IZO, ZnO, or $SnO_2$, may be formed as a transparent electrode layer on a translucent metal layer. The transparent electrode layer may be a single-layer film or a multi-layer film of multiple materials.

The structure of the organic EL device according to a preferred embodiment of the present invention may include at least first electrodes, organic layers composed of multiple layers including at least a carrier transport layer and a light emitting layer (non-carrier transport layer), and second electrodes. The organic EL device structure may also include a layer, e.g., the above-described oxide layer, in addition to first electrodes, functional material layers composed of a single layer or multiple layers including at least a light emitting layer, and second electrodes.

FIRST EXAMPLE

Now, a first example of an organic EL display according to a preferred embodiment of the present invention will be described in detail with reference to the accompanying drawing.

Figure 2:
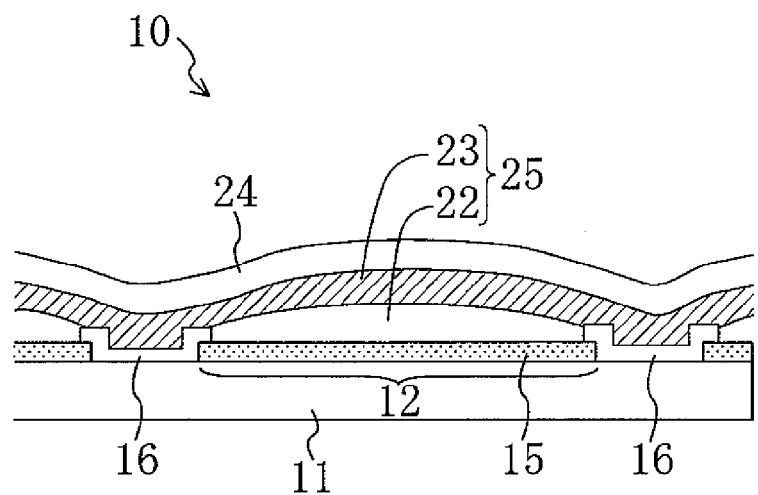
FIG. 2 is a cross-sectional view taken along the line A-A of FIG. 1.
Figure 3:
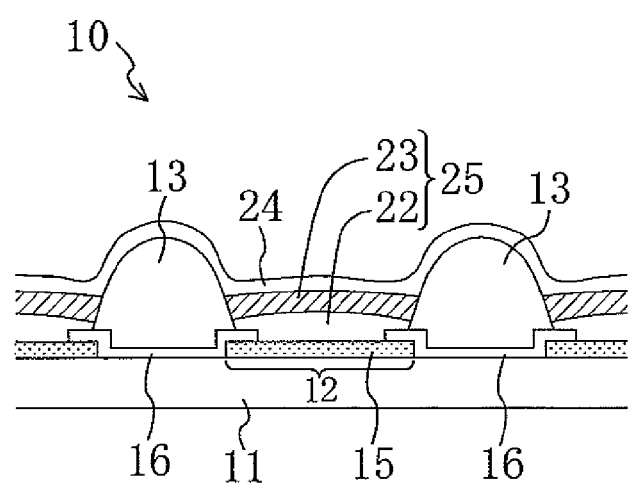
FIG. 3 is a cross-sectional view taken along the line B-B of FIG. 1.

FIG. 1 is a plan view of a substrate 11 in an organic EL display 10 according to the first example of a preferred embodiment of the present invention, showing the positional relationship between pixel areas 12 and a barrier 13 formed on the substrate. FIG. 2 is a cross-sectional view taken along the line A-A of FIG. 1. FIG. 3 is a cross-sectional view taken along the line B-B of FIG. 1.

Manufacturing Process of the Organic EL Display 10

First, a glass substrate was prepared, and TFTs fabricated using an amorphous silicon film or a polysilicon film were formed in a matrix on the glass substrate. An ITO film having a thickness of 100 nm was then formed by sputtering, thereby producing a substrate 11.

The ITO film over the substrate 11 was subsequently patterned utilizing a photolithographic technique with a ferric chloride solution used as an etchant, thereby forming positive electrodes 15. The positive electrodes 15 were formed so as to be defined in respective pixel areas 12. The distance between adjacent pixel areas 12 was 180 μm (in the column direction C), and 60 μm (in the row direction R). The positive electrodes 15 were separated from the TFTs by an interlayer dielectric film functioning as a planarizing layer, and were electrically connected with the underlying thin film transistors formed in a matrix through contact holes formed through the interlayer dielectric film.

Then, $SiO_2$ was deposited over the substrate 11 to a thickness of 150 nm by sputtering, thereby forming a $SiO_2$ film.

The $SiO_2$ film was subsequently patterned using a photolithographic technique, and then the $SiO_2$ layer 16 was etched with buffered HF (hydrofluoric acid) used as an etchant so as to expose the positive electrodes 15. The dimensions of each exposed area were 100 μm (in the column direction C)×35 μm (in the row direction R).

Next, a photosensitive acrylic resin was applied on the patterned SiO$_2$ layer 16 and the positive electrodes 15 to a thickness of about 2 μm by spin coating, and was then exposed and developed, thereby forming a barrier 13 on the SiO$_2$ layer 16.

In this process step, the barrier 13 was formed with pixel area defining recesses 20 and communication recesses 21. The pixel area defining recesses 20 which define the pixel areas 12, and the communication recesses 21 extending continuously from the pixel area defining recesses 20 and having a narrower width than the pixel area defining recesses 20 were formed simultaneously using the same material.

The width (the distance in the row direction R) of each communication recess 21 was 25 μm. The dimensions of the pixel areas 12 defined by the barrier 13 were 170 μm (in the column direction C)×50 μm (in the row direction R).

Subsequently, a PEDOT/PSS solution was prepared as a hole transport layer solution by using PEDOT/PSS (a mixture of polyethylenedioxythiophene and polystyrenesulfonate) as a hole transporting material, and water as a solvent for dispersing or dissolving PEDOT/PSS. The PEDOT/PSS solution was prepared so as to have a viscosity of about 8 cp and a surface tension of about 30 dyn/cm.

Next, an inkjet device having an inkjet head, a substrate mounting stage, and the like was provided and fixed above pixel areas 12 on the substrate 11 that were to be processed. In the inkjet head, the nozzle diameter was about 20 μm, and the amount of hole transport layer solution discharge was 4 to 6 pl.

The substrate 11 was then placed on the substrate mounting stage. With the substrate mounting stage being moved in the column direction C of the pixel areas 12 at a rate of 5 mm/s at room temperature, flushing was performed 100 times from the inkjet head in order to prevent unwanted stoppage of discharging.

Then, the rate at which the substrate mounting stage was moved was increased to 30 mm/s, and application of a desired amount of hole transport layer solution on desired pixel areas 12 was started in the column direction C.

Continuously, the hole transport layer solution was applied for 300 pixel areas in the column direction C of the pixel areas 12. In the row direction R, the hole transport layer solution was applied for 20 pixel areas. These 20 pixel areas are the maximum number of pixel areas in the column direction for which application can be performed at a time, and this maximum number is determined by the number of nozzles in the inkjet head.

The substrate mounting stage was then moved in the row direction R by 1200 μm, and the hole transport layer solution was similarly applied for 300 pixel areas in the column direction C. By repeating this scanning, application was performed for 500 pixel areas in the row direction R.

Next, the substrate 11 with the hole transport layer solution applied in the pixel areas 12 was left to stand in a vacuum dryer for 20 minutes at room temperature at 1 Torr, thereby drying and removing the water, that is, the solvent component, in the hole transport layer solution. The substrate 11 was then baked on a hot plate for 5 minutes at 200° C., thereby forming hole transport layers 22.

A light emitting layer solution was then prepared using a polyfluorene-based green light emitting material as a light emitting layer material, and an aromatic mixed solvent as a solvent. The light emitting layer solution was prepared so as to have a viscosity of about 15 cp and a surface tension of about 30 dyn/cm.

Subsequently, the light emitting layer solution, like the above-described hole transport layer solution, was applied by an inkjet system onto the pixel areas 12 having the hole transport layers 22 formed therein. In this process step, the light emitting layer solution was also applied on the communication recesses 21 at the same time, so that the droplets in adjacent pixel areas 12 in the column direction C extend therebetween.

The substrate 11 having the light emitting layer solution applied in the pixel areas 12 was then dried on a hot plate in a N$_2$ atmosphere for 60 minutes at 200° C. to dry and remove the solvent component in the light emitting layer solution, thereby forming light emitting layers 23.

Then, using a known technique, negative electrodes 24 made of Ba and Al were formed over the substrate 11 having the hole transport layers 22 and the light emitting layers 23 formed thereover.

In this way, the organic EL display 10 was manufactured.
Effects of the Organic EL Display 10

Formed in the organic EL display 10 thus manufactured were the positive and negative electrodes 15 and 24, the functional material layers 25 provided in the respective pixel areas 12 between the positive and negative electrode 15 and 24 and including the hole transport layers 22 (carrier transport layers) and the light emitting layers 23 (non-carrier transport layers), and the barrier 13 that defines the pixel areas 12. The barrier 13 was formed with the communication recesses 21 for extending the light emitting layers 23 through pixel areas 12 adjacent to each other in the pixel areas 12 defined by the barrier 13. This structure prevented droplet accumulation that occurs in the conventional structure in which the droplets for forming the light emitting layers 23 accumulate in the respective central portions of the pixel areas 12. Accordingly, the hole transport layers 22 and the negative electrodes 24 were not in contact with each other, thus preventing leakage current that occurs in the conventional structure.

In this first example, the communication recesses 21 between the adjacent pixel areas 12 were each realized preferably as a single narrow-width portion extending from the barrier 13, but are not limited thereto, and may be formed in various other shapes.

Figure 4:
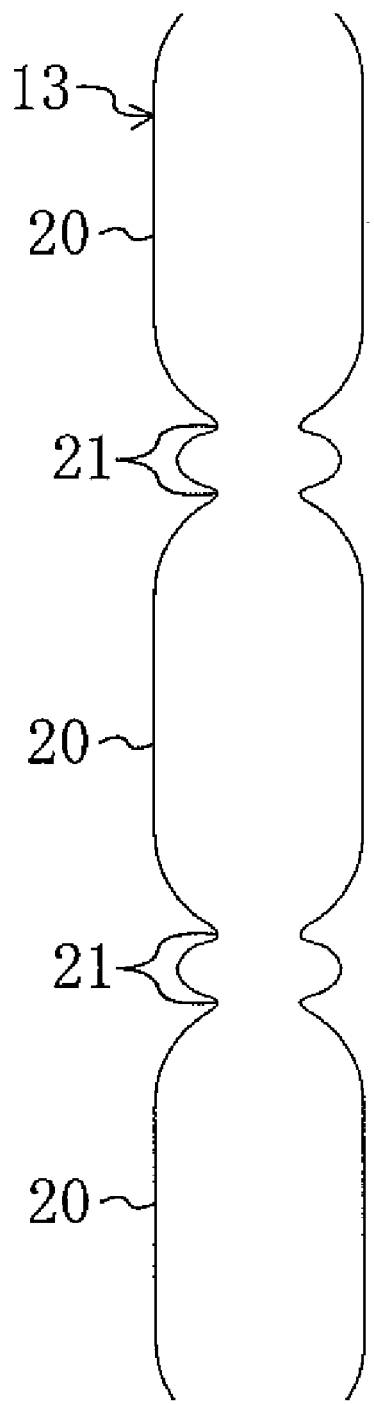
FIG. 4 is a plan view of communication recesses each including two narrow-width portions.

For example, each communication recess 21 may have two narrow-width portions as shown in FIG. 4, or may have three or more narrow-width portions. In that case, the droplets of a functional material applied on the communication recesses 21 between the pixel areas 12 are retained more favorably without flowing into the pixel areas 12, thereby enabling the hole transport layers 22 to be formed in the separate pixel areas 12 more effectively.

SECOND EXAMPLE

Now, a second example of an organic EL display according to a preferred embodiment of the present invention will be described in detail with reference to the accompanying drawing. In the second example, the same members as those of the organic EL display 10 of the foregoing first example are identified by the same reference numerals, and description thereof will be omitted herein.

Figure 5:
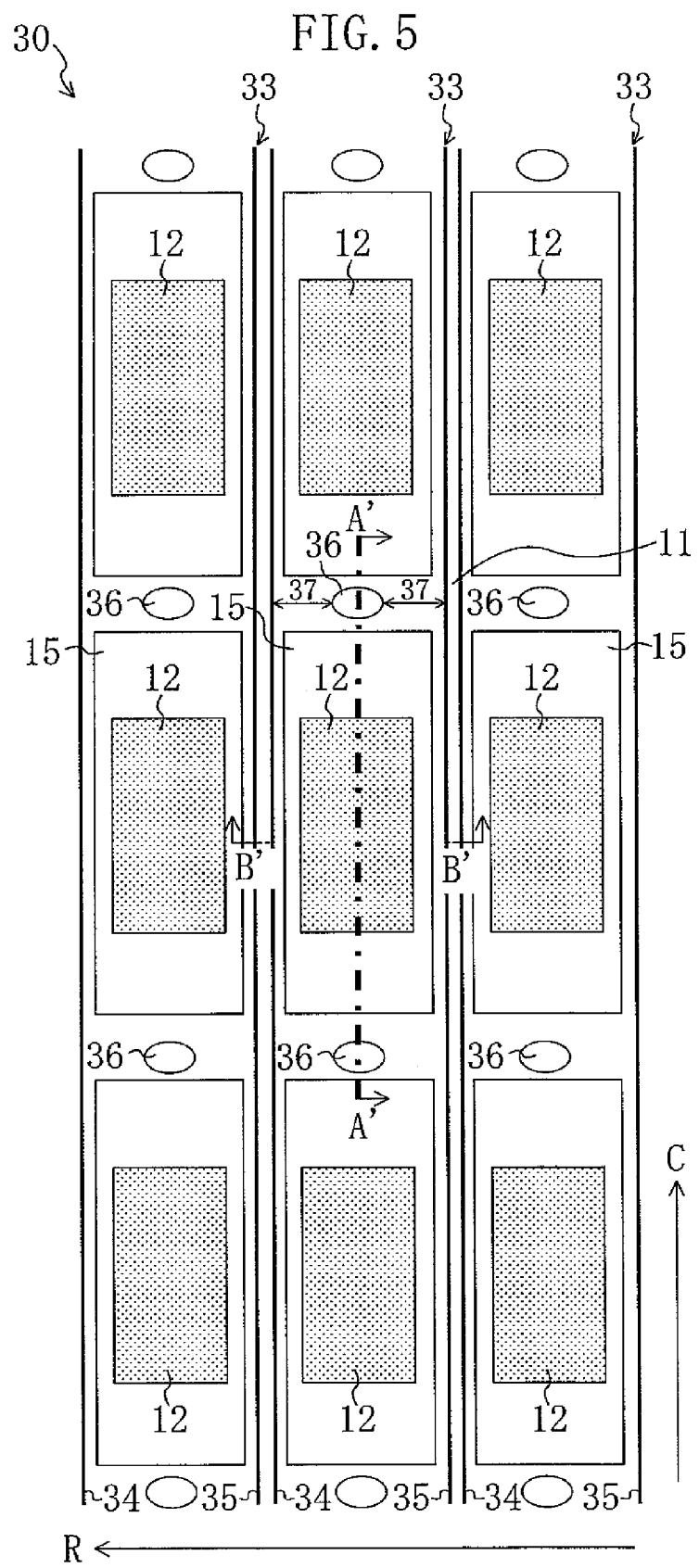
FIG. 5 is a plan view of a substrate in an organic EL display according to another preferred embodiment of the present invention, showing a positional relationship between pixel areas and a barrier.
Figure 6:
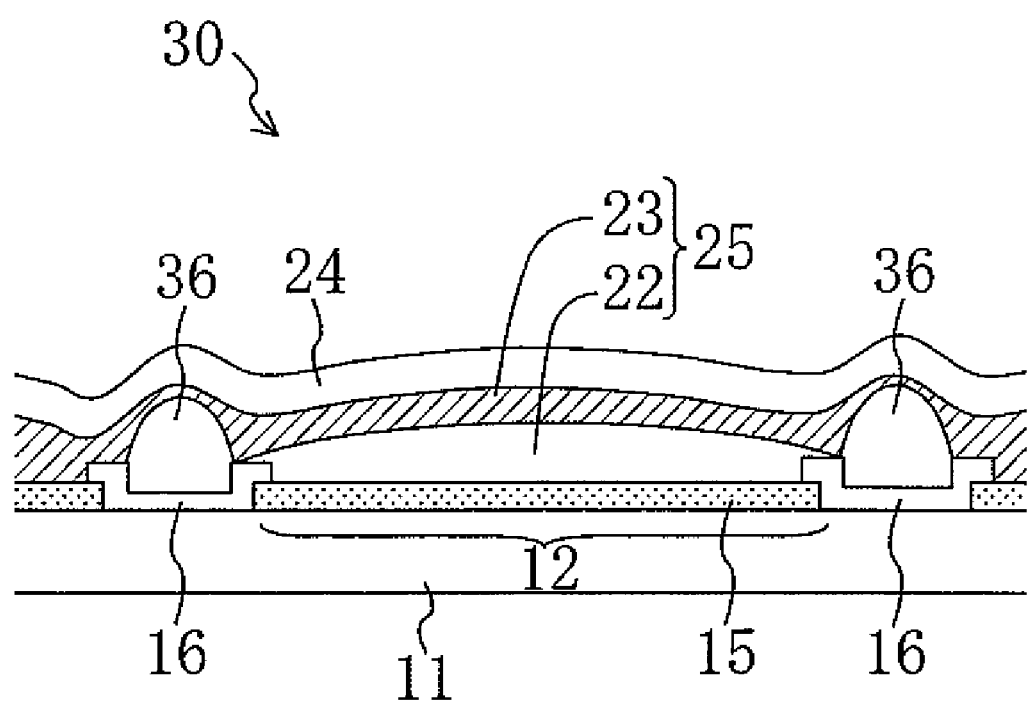
FIG. 6 is a cross-sectional view taken along the line A'-A' of FIG. 5.

FIG. 5 is a plan view of a substrate in an organic EL display 30 according to the second example a preferred embodiment of the present invention, showing the positional relationship between pixel areas 12 and a barrier 33. FIG. 6 is a cross-sectional view taken along the line A'-A' of FIG. 5. A cross-sectional view taken along the line B'-B' of FIG. 5 shows the same structure as FIG. 3 provided in the first example, and therefore, illustration thereof will be omitted herein.
Manufacturing Process of Organic EL Display 30

In the second example, the organic EL display 30 was manufactured through process steps similar to those of the first example. In this example, as shown in FIG. 5, the barrier 33 is composed of first and second linear portions 34 and 35 each formed continuously in the column direction C of the pixel areas 12, and island-shaped portions 36 provided between the first and second linear portions 34 and 35 and between adjacent pixel areas 12. Communication recesses 37 include the spaces between the first and second linear portions 34 and 35 and the island-shaped portions 36 disposed therebetween.

The island-shaped portions 36 were formed at the same time, and using the same material, as the first and second linear portions 34 and 35. The island-shaped portions 36, as well as the first and second linear portions 34 and 35, were formed over the substrate 11 as upwardly rising projections. The island-shaped portions 36 were formed so as to have a length of about 25 µm with their major axis extending in the row direction R. The island-shaped portions 36 were also formed so as to have a width of about 10 µm with their minor axis extending in the column direction C. This allowed the width of each communication recess 37, obtained as the sum of the spaces formed between each island-shaped portion 36 and the first and second linear portions 34 and 35, to be smaller than the width of each pixel area 12 (the dimension of each pixel area 12 in the row direction R).

Effects of the Organic EL Display 30

In the organic EL display 30 thus manufactured, the barrier 33 includes the first and second linear portions 34 and 35 each arranged continuously in the column direction C of the pixel areas 12, and the island-shaped portions 36 provided between adjacent pixel areas 12. The communication recesses 37 include the spaces between the first and second linear portions 34 and 35 and the island-shaped portions 36 formed therebetween. Therefore, the communication recesses 37 allowed light emitting layers 23 (non-carrier transport layers) to extend through adjacent pixel areas 12. On the other hand, the communication recesses 37 having a narrower width than the pixel areas 12 (whose width is equal to the distance between the first and second linear portions 34 and 35) prevented hole transport layers 22 (carrier transport layers) from extending, and their droplets from flowing, into adjacent pixel areas 12, thus enabling the formation of the hole transport layers 22 in the separate pixel areas 12.

Accordingly, this structure prevented contact between the carrier transport layers, and contact between the hole transport layers 22 and the negative electrodes 24 without interposition of the non-carrier transport layers using a low-conductivity organic layer or the like, thereby preventing leakage current that occurs in the conventional structure.

In the second example, the island-shaped portions 36 are formed lower than the first and second linear portions 34 and 35 due to characteristics of the photolithographic technique. This causes the light emitting layers 23 to extend over the island-shaped portions 36 to extend through adjacent pixel areas 12. However, the present invention is not limited to this structure. Since it is sufficient if the light emitting layers 23 extend into the communication recesses 37 so as to be also present between adjacent pixel areas 12, the light emitting layers 23 need not necessarily be present on the island-shaped portions 36.

Figure 7:
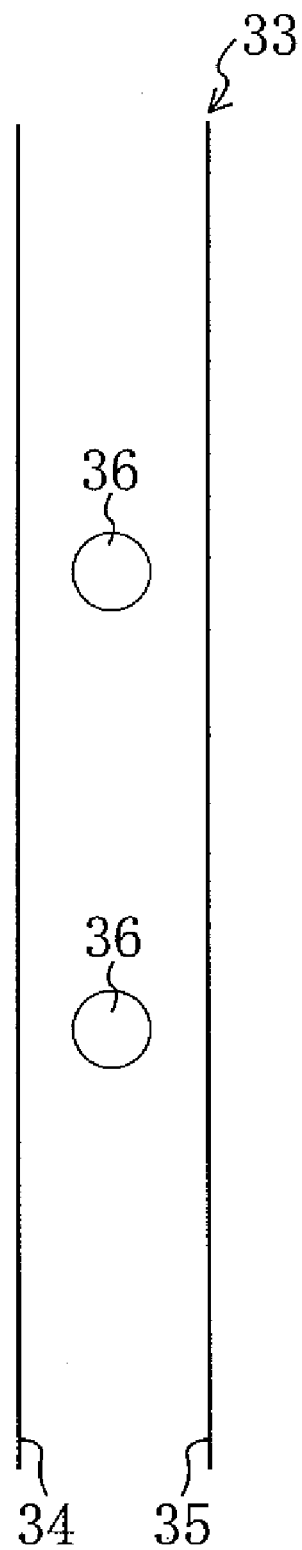
FIG. 7 is a plan view of a barrier including island-shaped portions formed in the shape of an approximate circle.
Figure 8:
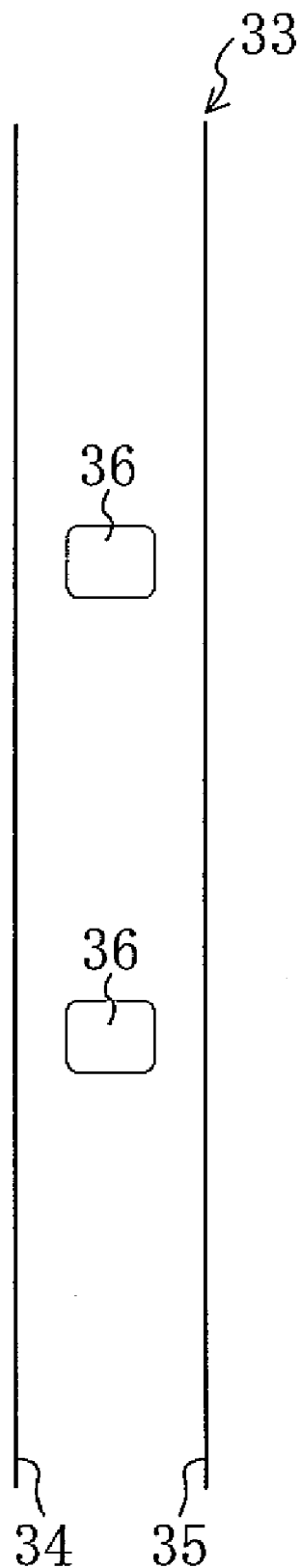
FIG. 8 is a plan view of a barrier including island-shaped portions formed in the shape of an approximate quadrilateral.

Also, in the second example, the island-shaped portions 36 are preferably formed in the shape of an approximate ellipse, but may be formed in other shapes. For example, the island-shaped portions 36 may be formed in the shape of an approximate circle as shown in FIG. 7 or in the shape of an approximate quadrilateral as shown in FIG. 8.

Figure 9:
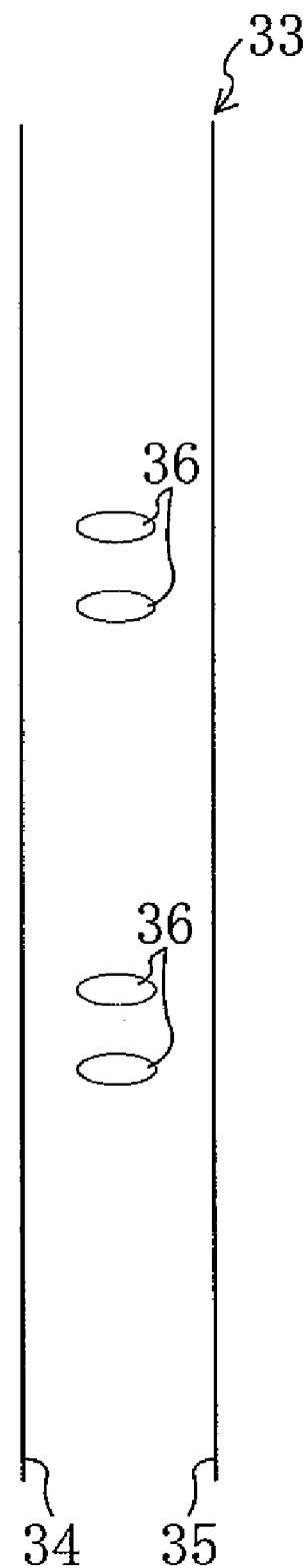
FIG. 9 is a plan view of a barrier in which multiple island-shaped portions are arranged in parallel or substantially in parallel in the direction of columns of pixel areas.
Figure 10:
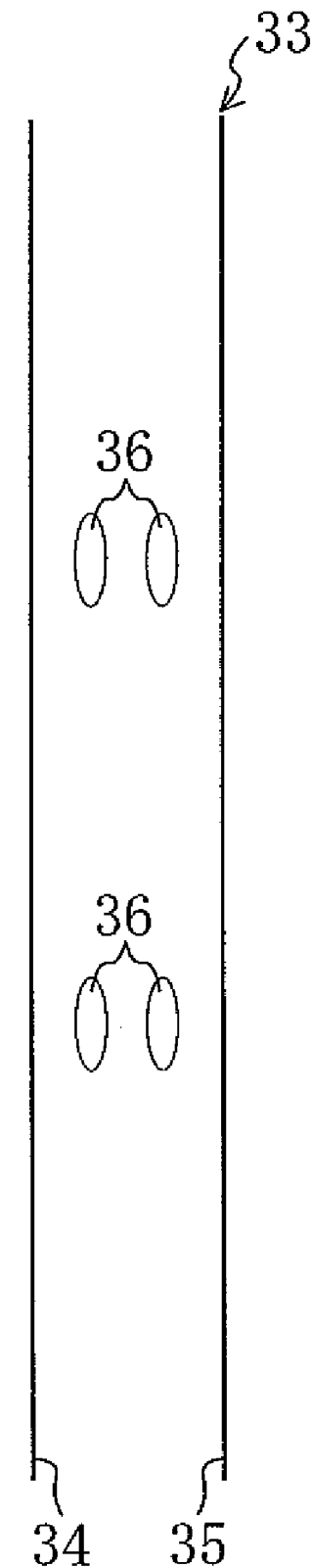
FIG. 10 is a plan view of a barrier in which multiple island-shaped portions are arranged in parallel or substantially in parallel in the direction of rows of pixel areas.
Figure 11:
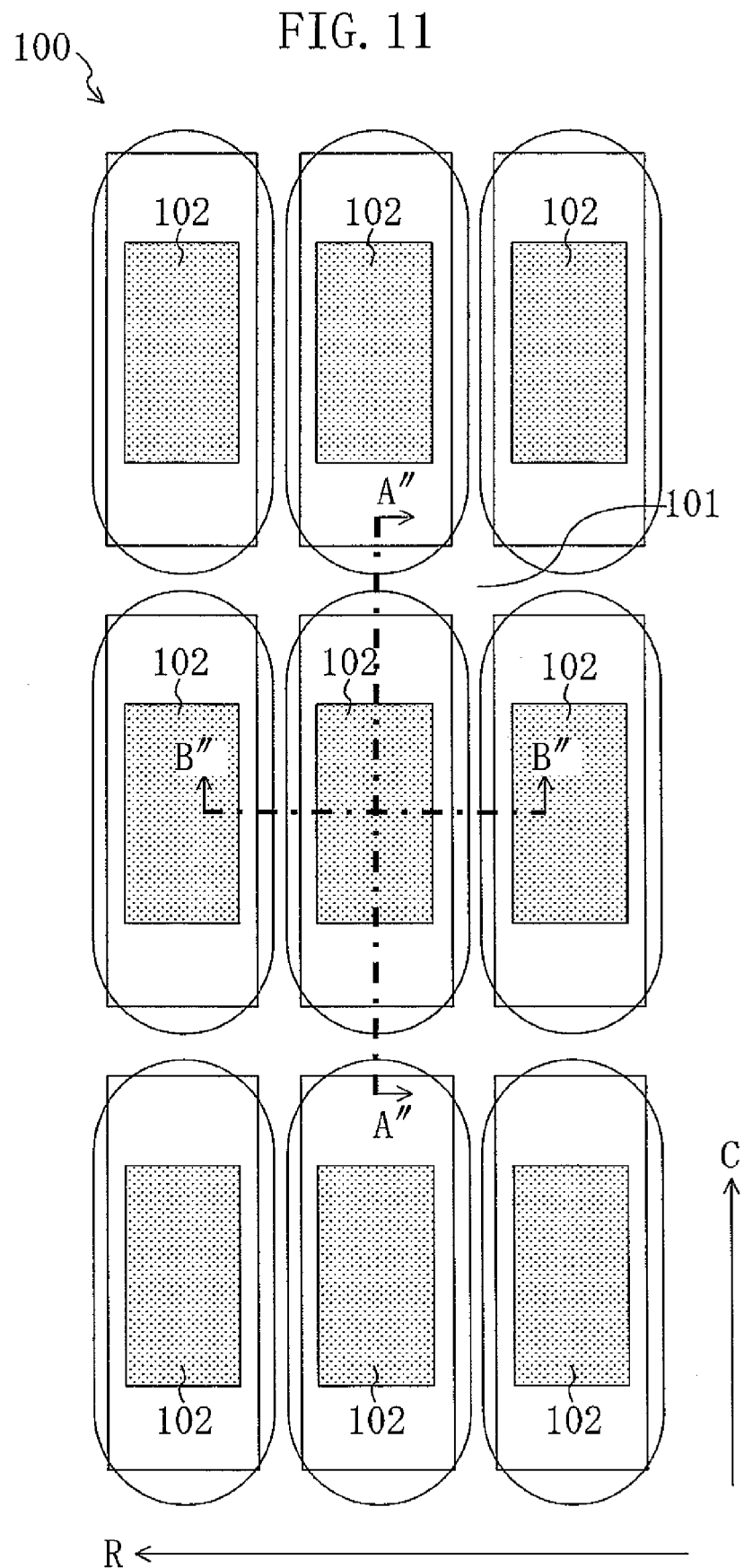
FIG. 11 is a plan view of a substrate in a conventional organic EL display.
Figure 12:
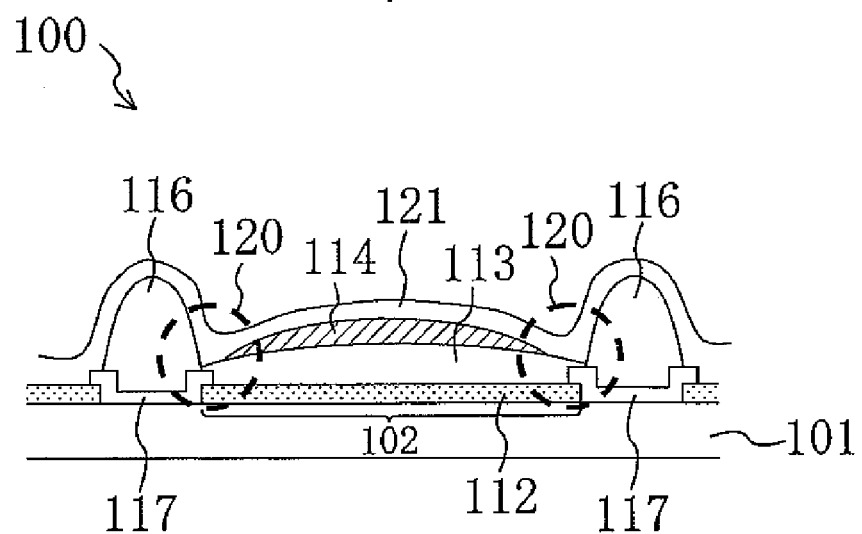
FIG. 12 is a cross-sectional view taken along the line A"-A" of FIG. 11.
Figure 13:
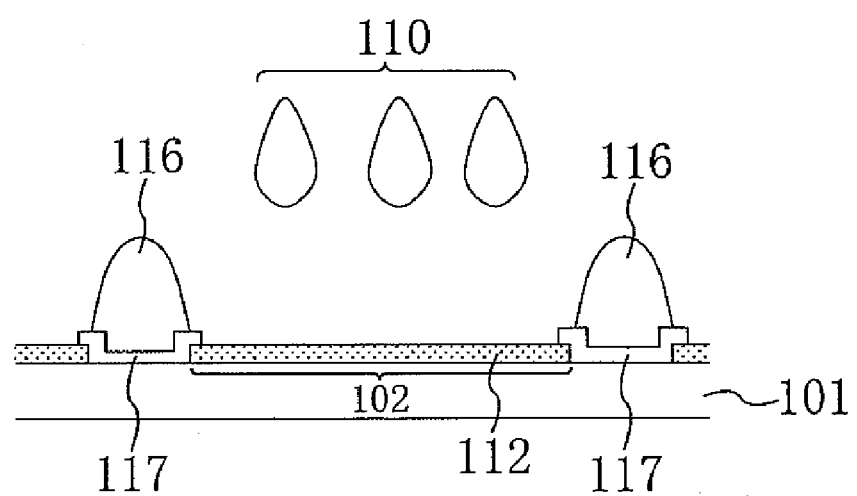
FIG. 13 shows a process step in which droplets are applied on a positive electrode.
Figure 14:
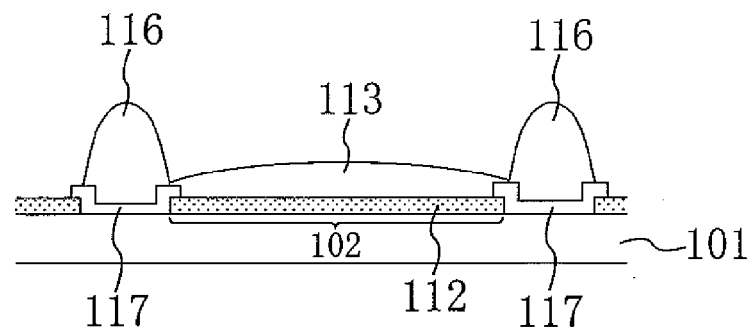
FIG. 14 shows a process step in which a hole transport layer is formed.
Figure 15:
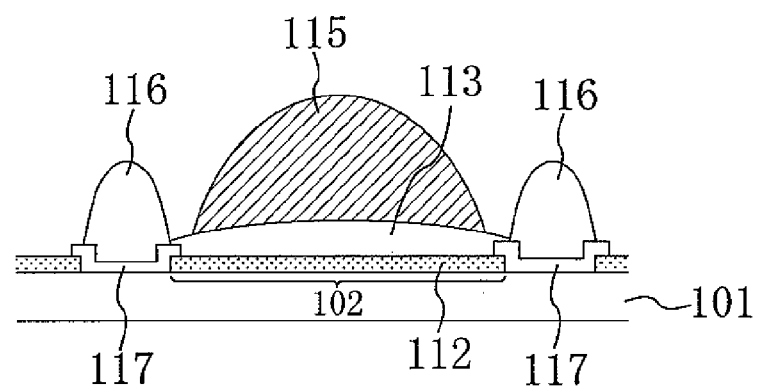
FIG. 15 shows a process step in which droplets are applied on the hole transport layer.
Figure 16:
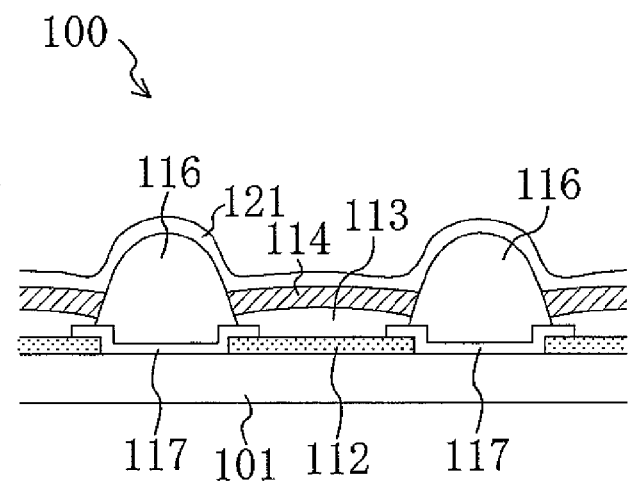
FIG. 16 is a cross-sectional view taken along the line B"-B" of FIG. 11.

Furthermore, in the second example, one island-shaped portion 36 is disposed between adjacent pixel areas 12, however, multiple island-shaped portions 36 may be arranged in parallel or substantially in parallel in the column or row direction of the pixel areas 12 as shown in FIGS. 9 and 10.

Moreover, in the first and second examples, the hole transport layers 22 are formed in the respective pixel areas 12 so as to be separate from each other, and the light emitting layers 23 are formed continuously through adjacent pixel areas 12, for example. Nevertheless, the present invention is not limited to this. At least one type of non-carrier transport layer using a low-conductivity organic layer or the like may be continuously formed through adjacent pixel areas 12. Furthermore, electron transport layers and carrier blocking layers may also be provided. For example, the present invention is applicable to a structure in which at least one type of carrier transport layer (either hole transport layers or electron transport layers) is formed in a respective pixel area 12 so as to be separate from each other, and at least one type of non-carrier transport layer extends through adjacent pixel areas 12, and a structure in which all of the functional material layers including carrier transport layers extend through adjacent pixel areas 12. In such structures, at least either the low-conductivity carrier blocking layers or light emitting layers are formed continuously through adjacent pixel areas 12. Therefore, contact between the carrier transport layers, and contact between the hole transport layers and the negative electrodes, between the electron transport layers and the positive electrodes, and between the positive and negative electrodes are prevented without interposition of the low-conductivity organic layers, thereby preventing leakage current that occurs in the conventional structure.

Also, in the first and second examples, the respective widths of the communication recesses 21 and 37 are not limited to the aforementioned dimensions. The widths of the communication recesses 21 and 37 are preferably greater than about ⅙, but smaller than about ⅚, for example, of the widths of the pixel areas 12 defined by the respective barriers 13 and 33.

Moreover, in the first and second examples, the barriers 13 and 33 and the communication recesses 21 and 37 need not necessarily be formed at the same time by using the same material, and may be formed in different process steps using different materials.

Furthermore, though the active-matrix organic EL displays 10 and 30 have been described in the first and second examples, the present invention is also similarly applicable to passive-matrix organic EL displays in which TFTs are not formed. In that case, positive electrodes 15 may be continuously formed linearly in the column direction C, while negative electrodes 24 may be continuously formed linearly in the row direction R by using a mask or the like during deposition.

Also, in the first and second examples, PEDOT/PSS and polyfluorene-based green light emitting material are respectively used as a hole transport layer material and a light emitting layer material. However, the present invention is not limited to this, and other functional materials may also be used.

Moreover, though the hole transport layers 22 and the light emitting layers 23 are both formed by an inkjet system in the first and second examples, the present invention is not limited to this. The formation of the hole transport layers 22 may be performed by any other method in which a bank for retaining droplets is provided, and those layers are formed by applying droplets on any other layer. That is, the components other than the light emitting layers 23 extending through adjacent pixel areas 12 may be formed not by an inkjet system but by other methods such as a nozzle coating process.

As set forth above, the present invention relates to organic EL displays and manufacturing methods thereof.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An organic EL display, comprising: a substrate including pixel areas are arranged in a matrix; and first electrodes, second electrodes, functional material layers, and a barrier arranged to define the pixel areas and arranged over the substrate, the functional material layers being provided in the respective pixel areas between the first and second electrodes and each including a carrier transport layer and a non-carrier transport layer; where the barrier includes communication recesses arranged to extend the non-carrier transport layers from respective first pixel areas to respective second pixel areas such that the non-carrier transport layers extend completely through both of the respective first pixel areas and the second pixel areas, each first pixel area and each second pixel area being adjacent to each other in the pixel areas defined by the barrier, wherein the barrier includes pixel area defining recesses which define the pixel areas, and the communication recesses are arranged to extend continuously from the pixel area defining recesses of the barrier and to have a narrower width than the pixel area defining recesses.

2. The organic EL display of claim 1, wherein the barrier includes:
   first linear portions and second linear portions each arranged continuously in a column or row direction of the pixel areas so that each of the pixel areas arranged in a matrix on the substrate is sandwiched between respective ones of the first linear portions and the second linear portions, and
   island-shaped portions each provided between respective ones of the first linear portions and the second linear portions and between respective ones of the first pixel areas and the second pixel areas; and
   each communication recess includes spaces located between respective ones of the first linear portions and the second linear portions and one of the island-shaped portions provided therebetween.

3. The organic EL display of claim 2, wherein the island-shaped portions are arranged such that two or more of those island-shaped portions are arranged in parallel or substantially in parallel with each other in the column and/or row direction of the pixel areas.

4. The organic EL display of claim 1, wherein a total width of each communication recess is greater than about one-sixth of, but smaller than about five-sixths of, a width of each pixel area defined by the barrier.

5. The organic EL display of claim 1, wherein each carrier transport layer and each non-carrier transport layer include a plurality of layers, at least one of the layers of each carrier transport layer is separated between the respective first pixel area and the respective second pixel area adjacent to each other, and at least one of the layers of each non-carrier transport layer extends from the respective first pixel area to the respective second pixel area adjacent to each other.

6. The organic EL display of claim 1, wherein each non-carrier transport layer includes a plurality of layers, and all of the layers of each non-carrier transport layer extend from the respective first pixel area to the respective second pixel area adjacent to each other.

7. The organic EL display of claim 1, wherein each carrier transport layer includes a plurality of layers, and all of the layers of each carrier transport layer are separated between the respective first pixel area and the respective second pixel area adjacent to each other.

8. A method for manufacturing an organic EL display, comprising the steps of:
   forming first electrodes in a matrix arrangement on a substrate to provide pixel areas;
   forming a barrier on the substrate so that the barrier defines the pixel areas;
   forming communication recesses in the barrier such that each of the communication recesses extends from a respective first pixel area to a respective second pixel area adjacent to each other in the pixel areas defined by the barrier;
   forming at least one carrier transport layer inside the barrier that defines the pixel areas;
   forming at least one non-carrier transport layer using an inkjet system from the respective first pixel area to the respective second pixel area across the communication recess provided therebetween; and
   forming second electrodes in the pixel areas on the substrate in which the at least one carrier transport layer and the non-carrier transport layers have been formed.

9. The method of claim 8, wherein the barrier and the communication recesses provided therein are formed simultaneously using the same material.

* * * * *